(12) United States Patent
Matsumura et al.

(10) Patent No.: US 7,998,770 B2
(45) Date of Patent: Aug. 16, 2011

(54) METHOD FOR FORMING A SEMICONDUCTOR LIGHT-EMITTING DEVICE

(75) Inventors: Atsushi Matsumura, Yokohama (JP); Tomokazu Katsuyama, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 433 days.

(21) Appl. No.: 12/153,372

(22) Filed: May 16, 2008

(65) Prior Publication Data
US 2009/0001408 A1 Jan. 1, 2009

(30) Foreign Application Priority Data
May 22, 2007 (JP) .................. 2007-135750

(51) Int. Cl.
*H01L 21/00* (2006.01)
(52) U.S. Cl. .............. 438/39; 438/40; 438/41; 438/164; 438/343; 257/80; 257/618; 257/623
(58) Field of Classification Search .................. 438/745, 438/747, 748, 750, 39, 40, 41, 164, 343; 257/102, 103, 79, 80, 452, 466, 586, 170, 257/600, 618, 623, 624
See application file for complete search history.

(56) References Cited

U.S. PATENT DOCUMENTS

| | | | | |
|---|---|---|---|---|
| 5,470,785 | A * | 11/1995 | Kondo | 438/41 |
| 6,955,994 | B2 * | 10/2005 | Watanabe et al. | 438/745 |
| 7,701,993 | B2 * | 4/2010 | Iga et al. | 372/46.01 |
| 7,720,123 | B2 * | 5/2010 | Takiguchi et al. | 372/46.01 |
| 7,772,023 | B2 * | 8/2010 | Hiratsuka | 438/39 |

FOREIGN PATENT DOCUMENTS
JP 06-085390 3/1994
* cited by examiner

*Primary Examiner* — Lex Malsawma
*Assistant Examiner* — Thanh Y Tran
(74) *Attorney, Agent, or Firm* — Smith, Gambrell & Russell, LLP

(57) ABSTRACT

A semiconductor light-emitting device with a new layer structure is disclosed, where the current leaking path is not caused to enhance the current injection efficiency within the active layer. The device provides a mesa structure containing active layer and a p-type lower cladding layer on a p-type substrate and a burying layer doped with iron (Fe) to bury the mesa structure, where the burying layer shows a semi-insulating characteristic. The device also provides an n-type blocking layer arranged so as to cover at least a portion of the p-type buffer lower within the mesa structure. The n-type blocking layer prevents the current leaking from the burying layer to the p-type buffer layer, and the semi-insulating burying layer that covers the rest portion of the mesa structure not covered by the n-type blocking layer prevents the current leaking from the n-type blocking layer to the n-type cladding layer within the mesa structure.

10 Claims, 6 Drawing Sheets

METHOD FOR FORMING A SEMICONDUCTOR LIGHT-EMITTING DEVICE

BACKGROUND OF THE INVENTION

1. Field of the Invention

The present invention relates to a method for forming a semiconductor light-emitting device, in particular, the method relates to a method to form a semiconductor laser diode with a mesa structure buried with a semi-insulating semiconductor layer doped with iron (Fe).

2. Related Prior Art

One type of a semiconductor laser diode (hereafter denoted as LD) has been well known where a mesa structure including an active layer formed on an InP substrate is buried by a burying layer. A Japanese Patent Application published as JP-H06-085390A has disclosed an LD with such an arrangement where the LD includes the mesa structure containing an n-type lower cladding layer, an active layer, a p-type upper cladding layer and a p-type contact layer, each sequentially grown on the n-type InP substrate, and a semi-insulating burying layer made of InP doped with iron (Fe) formed so as to bury the mesa structure.

Because irons in the burying layer behaves as an electron trap to show the semi-insulating characteristic, when it is in contact with a p-type layer, electrons trapped by iron atoms in the burying layer may recombine with holes injected from the p-type contact layer, which causes a current leaking path from the contact layer to the burying layer; accordingly, the efficiency to inject carriers within the active layer is reduced.

One solution to reduce such a leak current has been proposed, where an additional current blocking layer made of n-type InP is formed on the semi-insulating burying layer to electrically isolate the p-type contact layer from the semi-insulating burying layer. However, the path from the p-type cladding layer to the semi-insulating burying layer still exists and the current injection efficiency has a scope to be further enhanced.

SUMMARY OF THE INVENTION

A semiconductor light-emitting device according to the present invention has a feature that provides a p-type InP substrate; a mesa structure including a p-type buffer layer, an active layer, and an n-type cladding layer; an n-type blocking layer; and a semi-insulating burying layer. The n-type blocking layer covers the p-type InP substrate and at least the p-type buffer layer within the mesa structure to isolate the semi-insulating burying layer from the substrate and the p-type buffer layer.

The invention further provides a feature in a method to form the semiconductor light-emitting device, comprising steps of: (a) growing semiconductor layers including the p-type buffer layer, the active layer and the n-type cladding layer on the p-type semiconductor substrate in this order; (b) forming the mesa structure; (c) growing the n-type blocking layer on the p-type substrate, this blocking layer including a plane portion deposited on the p-type substrate and a wall portion deposited on both side surfaces of the mesa structure; (d) selectively etching the wall portion of the n-type blocking layer; and (e) growing the semi-insulating burying layer doped with iron so as to bury the mesa structure.

The light-emitting device of the invention may further provide an un-doped layer between the active layer and the p-type buffer layer. This un-doped layer may relax the condition required in the n-type blocking layer, in particular, a thickness of the layer. The n-type blocking layer may cover at least a portion of the un-doped layer within the mesa structure to isolate the p-type buffer layer from the semi-insulating burying layer.

According to the method of the invention, the n-type blocking layer may isolate the burying layer from the p-type substrate so as to prevent the inter-diffusion of dopants in the p-type substrate and in the burying layer, which may reduce the leak current. Because the selective etching forms the n-type blocking layer, the dimensions of the n-type blocking layer becomes optional; accordingly, the n-type cladding layer in the mesa structure may be reliably isolated from the n-type blocking layer.

Moreover, the process may further include the etching of the p-type substrate after the formation of the mesa structure. This additional etching may expose the surface of the p-type substrate with the (111) and its equivalent orientations. Because of the crystallographic characteristic of the semiconductor material, the surface with the (100) or its equivalent orientations is hard to be etched compared to surfaces with the (011) or (111) and their equivalent orientations, which enhances the selectiveness of the etching of the n-type blocking layer.

DESCRIPTION OF PREFERRED EMBODIMENTS

Next, preferred embodiments of the present invention will be described as referring to accompanying drawings.

Figure 1A:
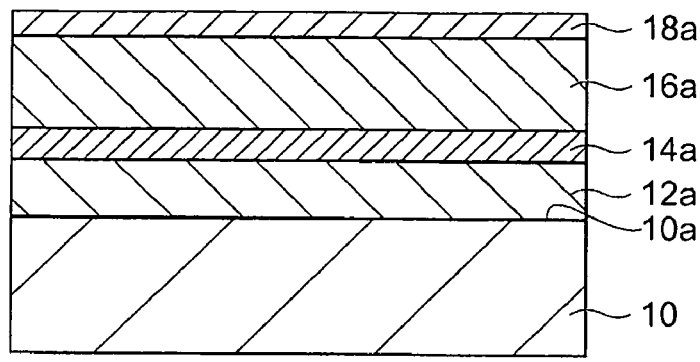
FIGS. 1A to 1C illustrate processes to grow semiconductor layers on the p-type semiconductor substrate and to form the mesa structure including grown layers.
Figure 1B:
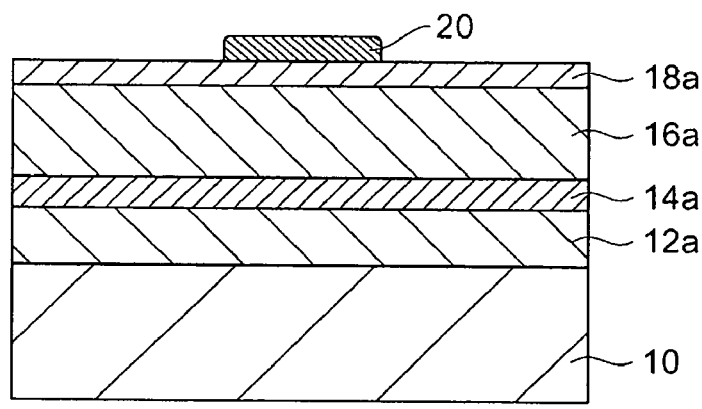
Figure 1C:
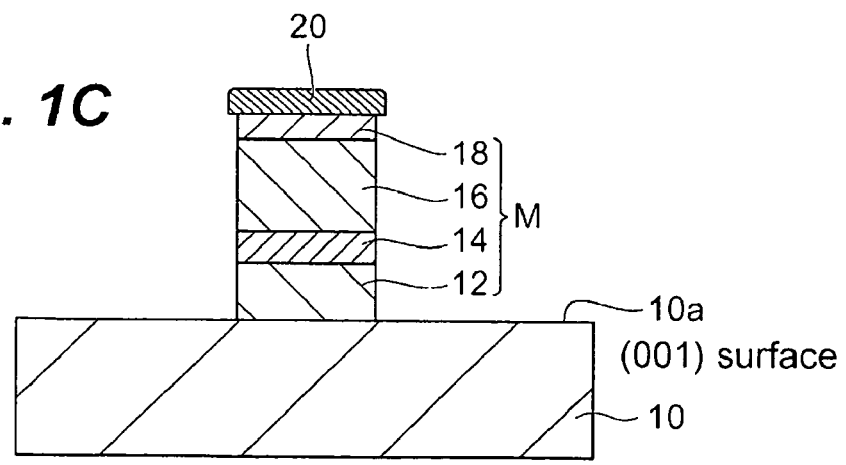

FIGS. 1A to 1C show processes to form the mesa structure M. First, a series of semiconductor layers, 12a, 14a, 16a and 18a, is grown on the primary surface 10 with the (001) surface orientation of a p-type InP substrate 10 by the conventional Organo-Metallic Vapor Phase Epitaxy (OMVPE) method.

The substrate is a p-type InP doped with zinc (Zn) by a concentration of about $1 \times 10^{18}$ cm$^{-3}$ and with a thickness of about 350 µm. The layer 12a becomes the p-type buffer layer 12, which is a p-type InP doped with Zn by a concentration of about $1 \times 10^{18}$ cm$^{-3}$ and with a thickness of about 550 nm.

The layer 14a becomes the active layer 14. The layer 14a may include a plurality of well layers and a plurality of barrier layers alternately stacked with each other, which constitutes the multiple quantum well (MQW) structure. The well layer may be InGaAsP with a band gap wavelength of 1.6 µm and a thickness of one layer of about 5 nm, while the barrier layer may be also InGaAsP but with a composition different from the well layer. The band gap wavelength of the barrier layer is about 1.25 µm and a thickness of one layer is about 10 nm, then a total thickness of the active layer becomes 224 nm. This active layer with the MQW structure may emit light with a wavelength of about 1.55 µm.

The layer 16a becomes the n-type cladding layer 16. The layer 16a may be an n-type InP doped with silicon (Si) by a concentration of about $1\times10^{18}$ cm$^{-3}$ and with a thickness of about 2000 nm. The layer 18a becomes a cap layer 18 in the mesa structure M. The layer 18a may be an n-type InGaAs doped with Si by a concentration of about $1\times10^{19}$ cm$^{-3}$ and with a thickness of about 200 nm.

Next, as shown in FIG. 1B, the process forms a mask layer 20 with a striped pattern on the layer 18a, a position of the mask layer 20 is aligned with the mesa structure M. The mask layer 20 may be made of silicon oxide (SiO$_2$) and with a thickness of about 2 µm. The striped pattern of this mask layer 20 may be formed by the ordinary photolithography with a subsequent etching process.

The process etches a portion of the semiconductor layers, 12a to 18a not covered by the mask layer 20 to form the mesa structure M. The conventional reactive ion etching (RIE) may carry out this etching process by a mixed reactive gas of methane (CH$_4$) and hydrogen (H$_2$). One exemplary composition of the reactive gas may be obtained by the flow rate of respective gasses of 25 sccm, which realizes an etching rate of about 1.8 µm an hour. However, the etching rate of the semiconductor layer strongly depends on various process conditions, such as the electrical power of the RF source, the pressure within the etching apparatus, and so on. The present rate described above enables the deep etching of about 3.6 to 3.7 µm to form, what is called as the high-mesa structure M shown in FIG. 1C.

Figure 2A:
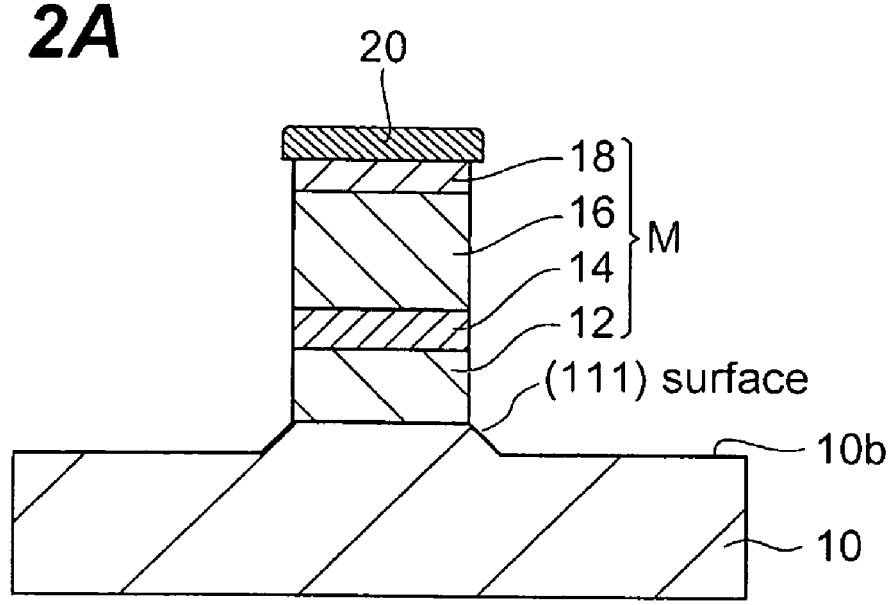
FIG. 2A illustrates a process to etch the p-type substrate to appear the surface with the (111) orientation.

After carrying out the dry etching using the RIE technique, the process etches a portion of the substrate 10. Specifically, the process first removes the residual carbons accumulated around the mesa structure M due to methane (CH$_4$) in the etching gas by an etchant containing sulfuric acid for 2 minutes. Subsequently, the process etches a portion of the p-type InP substrate 10 with a mixed solution of hydrochloric acid (HCl) 150 cc, acetic acid (CH$_3$COOH) 150 cc, hydrogen peroxide (H$_2$O$_2$) 60 cc, and water 150 cc for 30 seconds to remove the surface layer damaged by the foregoing RIE process. This second wet-etching exposes the InP surface 10b with the (111) orientation adjacent to the mesa structure M by removing the surface of the substrate 10 by about 100 nm as shown in FIG. 2A.

Figure 2B:
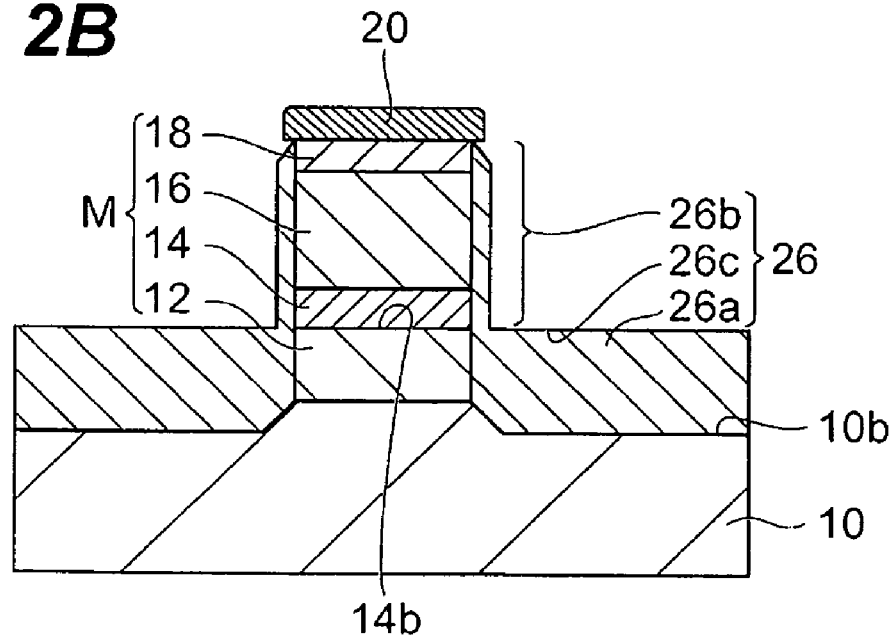
FIG. 2B illustrates a process to grow the n-type blocking layer on the p-type substrate and the side of the mesa structure.

Next, the n-type blocking layer 26 is grown on the substrate 10. FIG. 2B illustrates the process to grow the n-type blocking layer 26 on the surface 10b of the substrate 10 and the side surfaces of the mesa structure M. This n-type blocking layer 26 is an n-type InP doped with silicon (Si) by a concentration of about $1\times10^{19}$ cm$^{-3}$ and having a thickness of 1.2 to 1.3 µm grown by the OMVPE technique. Exemplary growth conditions are that a mixture of tri-methyle-indium (TMIn) and phosphine (PH$_3$) with mono-silane (SiH$_4$) for a dopant as the sources, a growth temperature of 620° C., and a reaction period of 35 to 40 minutes. The growth rate of about 2 µm an hour may be obtained under the conditions above.

The n-type blocking layer 26 includes a plane portion 26a deposited on the surface 10b of the substrate 10 and a wall portion 26b deposited on the side surfaces of the mesa structure M. The plane portion 26a may isolate the substrate 10 from the burying layer 32 and is preferable to have a thickness thereof smaller than a distance from the bottom 14b of the active layer 14 to the top 10b of the substrate 10 in the mesa structure, which is equivalent to a thickness of the p-type buffer layer 12. Specifically, the thickness of the plane portion 26a of the n-type blocking layer 26 is preferably 0.2 to 0.3 µm. This is due to the reason that the subsequent etching described below does not cause the current leaking path from the n-type cladding layer 16 to the n-type blocking layer 26. When the n-type blocking layer 26 has such a thickness, the burying layer 32, which has a semi-insulating characteristic primarily for electrons, may come in contact with the p-type buffer layer 12. However, because of its high resistivity of the semi-insulating burying layer 32, the contact between the p-type buffer layer 12 and the burying layer 32 is not significant.

More preferably, the thickness of the plane portion 26a of the blocking layer 26 is substantially equal to a thickness of the p-type buffer layer 12 added with the depth of the substrate etched in the foregoing process to level the bottom 14b of the active layer 14 with the top 26c of the blocking layer 26. The thickness of the blocking layer 26 may be adjustable by changing the growth time by the OMVPE technique.

Figure 3A:
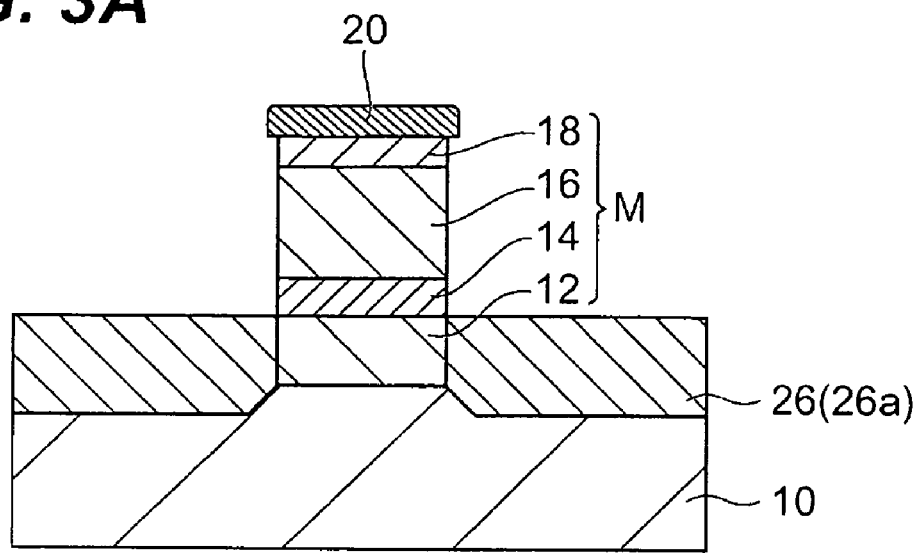
FIG. 3A illustrates a process to etch the wall portion of the n-type blocking layer deposited on the side of the mesa structure.

Next, the process selectively etches the blocking layer 26 as shown in FIG. 3A. The wet-etching carried out in this step using a solution containing hydrochloric acid (HCl) 60 cc, acetic acid (CH$_3$COOH) 300 cc and water 60 cc for 45 seconds selectively removes the wall portion 26b of the blocking layer 26. The etchant above mentioned selectively etches the surface of the n-type InP layer 26 with the (011) and (111) orientations but hardly etches the surface with the (100) and its equivalent orientations. Accordingly, this etchant may selectively remove the wall portion 26b deposited on the side surfaces of the mesa structure M because the plane portion 26a of the layer 26 reflects the (100) orientation of the substrate 10, while, the wall portion 26b shows the (011) and (111) surface orientations.

Figure 3B:
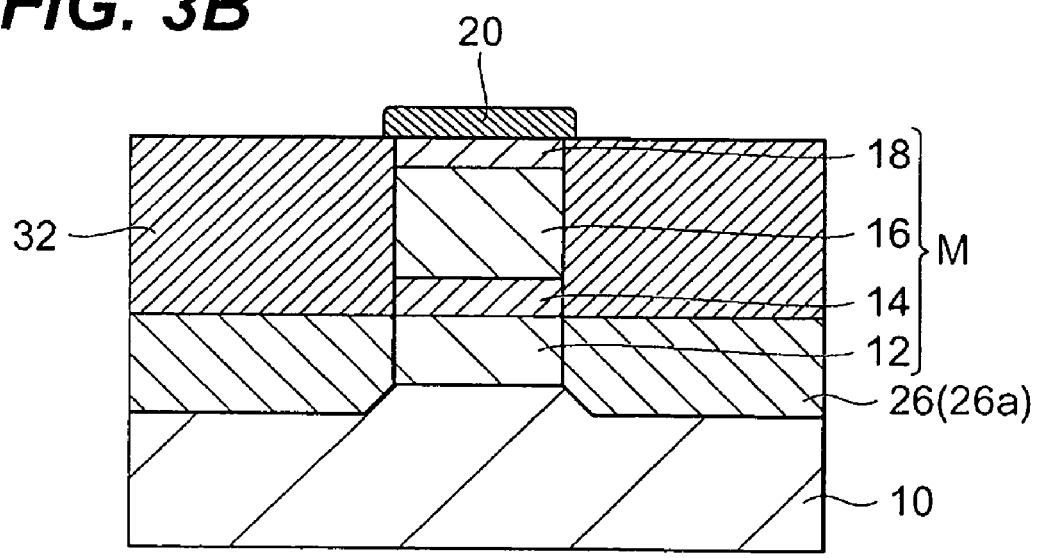
FIG. 3B illustrates a process to bury the mesa structure by growing the burying layer.

Next, the mesa structure M is buried with the semi-insulating burying layer 32 as illustrated in FIG. 3B. This burying layer 32 is an InP doped with iron (Fe) by a concentration of about $1.5\times10^{18}$ cm$^{-3}$ with the OMVPE technique using tri-methyle-indium (TMIn) and phosphine (PH$_3$) as the source materials and ferocene (C$_{10}$H$_{10}$Fe) as the dopant material. Exemplary growth conditions are that the growth temperature of 620° C. and the growth rate of 2 µm an hour, where it is necessary to take one hour and fifteen to twenty minutes to obtain a thickness of 2.5 µm enough to bury the mesa structure M.

Figure 4A:
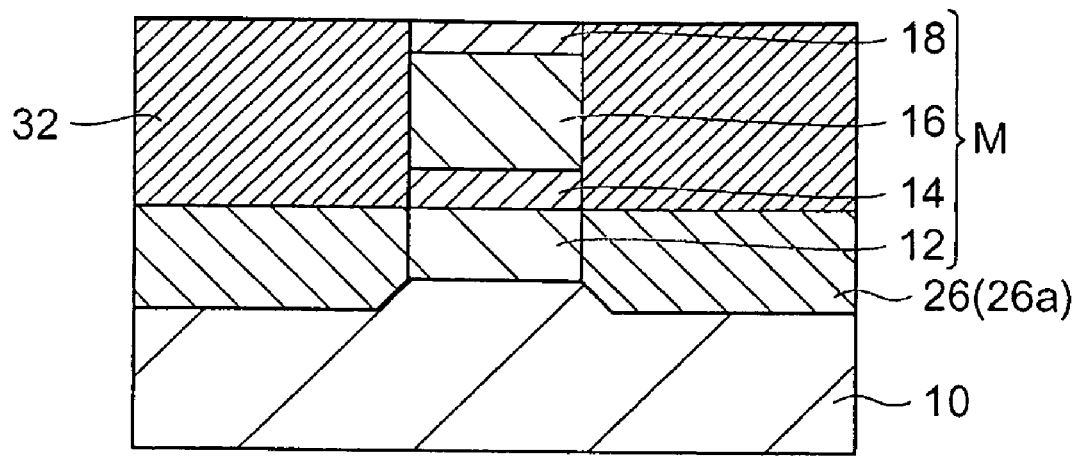
FIG. 4A illustrates a process to remove the cap layer.

After the growth of the burying layer 32, the mask 20 to form and to bury the mesa structure M is removed as shown in FIG. 4A. This mask 20 may be removed by, for instance, fluoric acid.

Figure 4B:
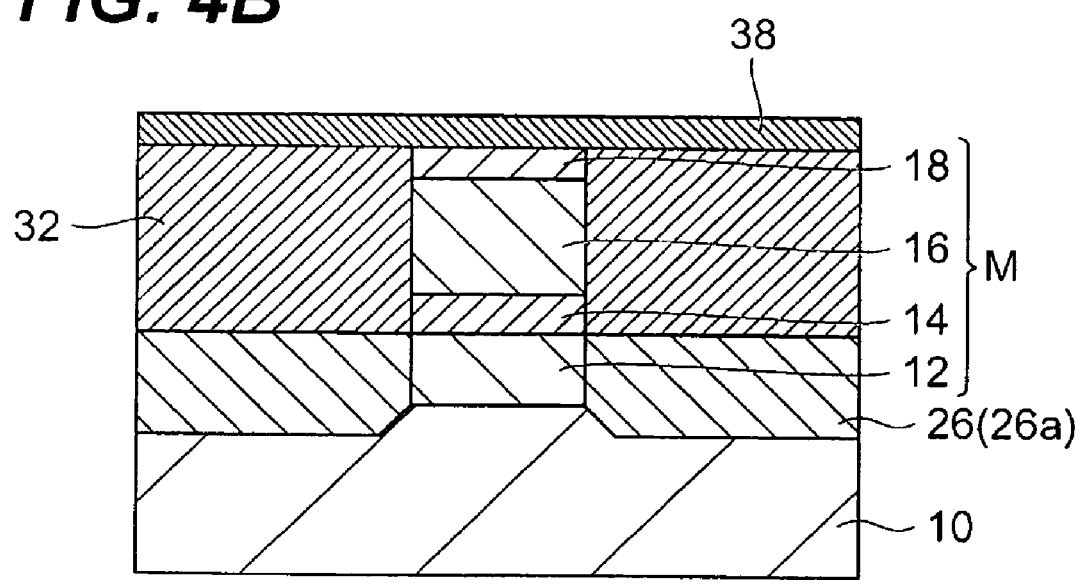
FIG. 4B illustrates a process to form the passivation layer on the mesa structure and on the burying layer.
Figure 5A:
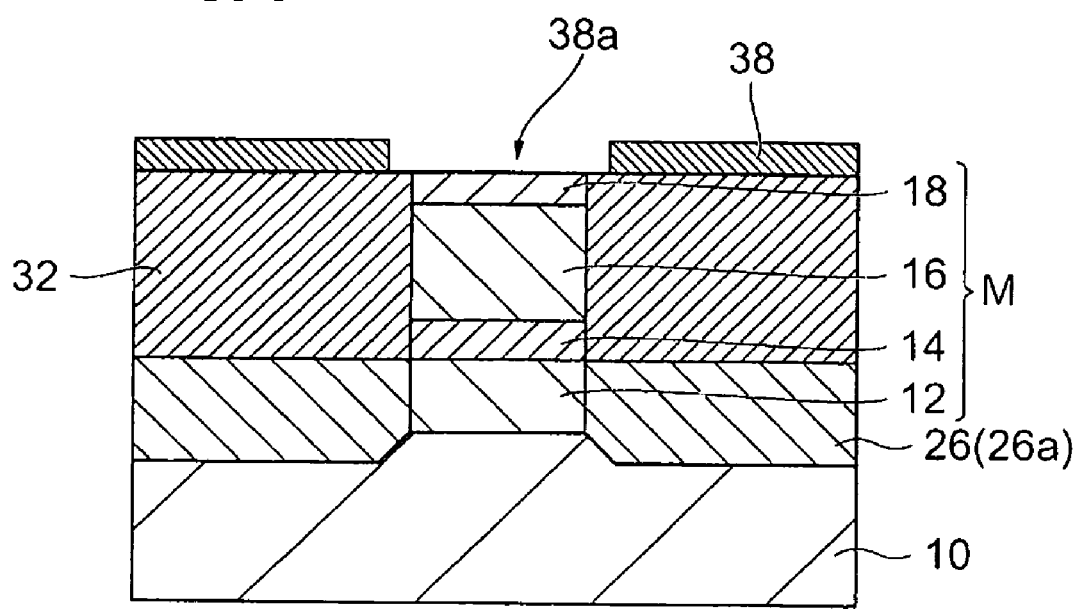
FIG. 5A illustrates a process to form the opening in the passivation layer.
Figure 5B:
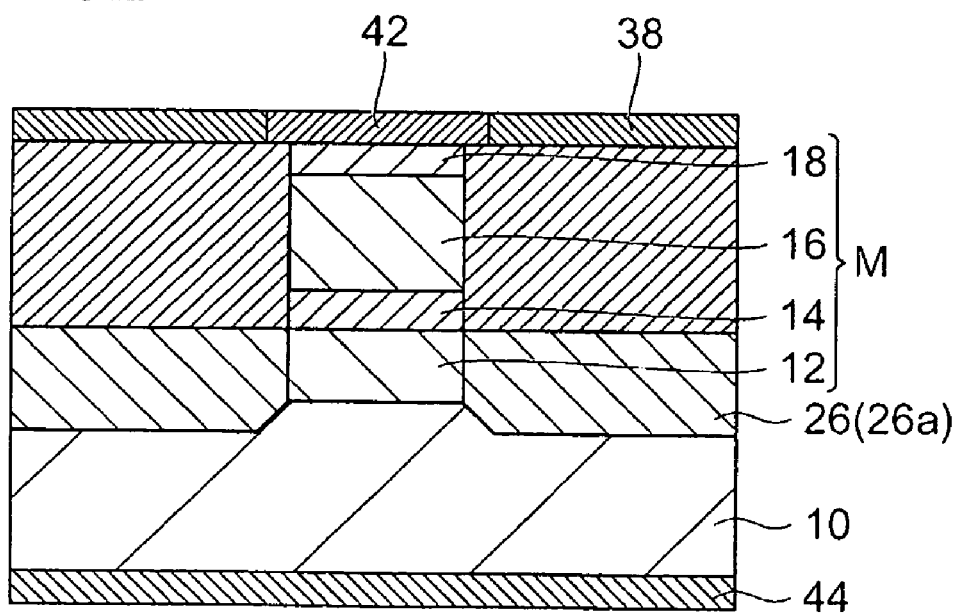
FIG. 5B illustrates a process to form the n-type electrode in the opening and the p-type electrode in the back surface of the p-type substrate.

Next, the process forms the passivation layer 38 made of silicon oxide SiO$_2$ to cover the top of the mesa structure M and the burying layer 32, as illustrated in FIG. 4B. Subsequently, this passivation layer 38 is processed so as to form an opening 38a to expose a portion above the mesa structure M (FIG. 5A). The upper electrode 42 fills the opening 38a of the passivation layer 38 and is put on the layer 38. This upper electrode 42 corresponds to the n-type electrode made of AuGe eutectic metal. On the other hand, another electrode 44 is processed on the back surface of the substrate 10 (FIG. 5B). This electrode 44 corresponds to the p-type electrode and is made of AuZn eutectic metal. Thus, the light-emitting device of the present invention is completed.

According to the method of the present invention thus explained, the n-type blocking layer 26 may prevent the inter-diffusion between dopants in the p-type substrate 10 and those in the semi-insulating burying layer 32. Moreover, because the n-type blocking layer 26 is formed by the OMVPE technique and the subsequent selective etching, the physical shape of the blocking layer 26, especially the thickness of the plane portion 26b may be optionally controlled and the blocking layer 26 may be escaped from being in contact with the n-type cladding layer 16 in the mesa structure M, which effectively prevents the current leaking path from causing.

The present invention has various modifications not restricted to those embodiments described above. It would be possible for an ordinal artisan in the fields to vary semiconductor materials of respective layers, their physical dimensions and conditions to process the semiconductor layers depending on requests.

For instance, it is possible to put separate confinement hetero-structure (SCH) layers between the MQW active layer 14 and the p-type buffer layer 12 and between the MQW active layer 14 and the n-type cladding layer 16. These SCH layers may separately confine the carries within the MQW active layer 14 and the light within the MQW active layer 14 and these SCH layers. These SCH layers may have a thickness of about 50 nm and may be made of un-doped GaInAsP when the MQW active layer 14 is made of GaInAsP. These SCH layers, in particular, the layer between the MQW active layer 14 and the p-type buffer layer 12 may relax the condition of the thickness of the n-type blocking layer 26, that is, the top level of the plane portion 26b of the blocking layer 26 may be within the range of the thickness of this SCH layer.

Figure 6:
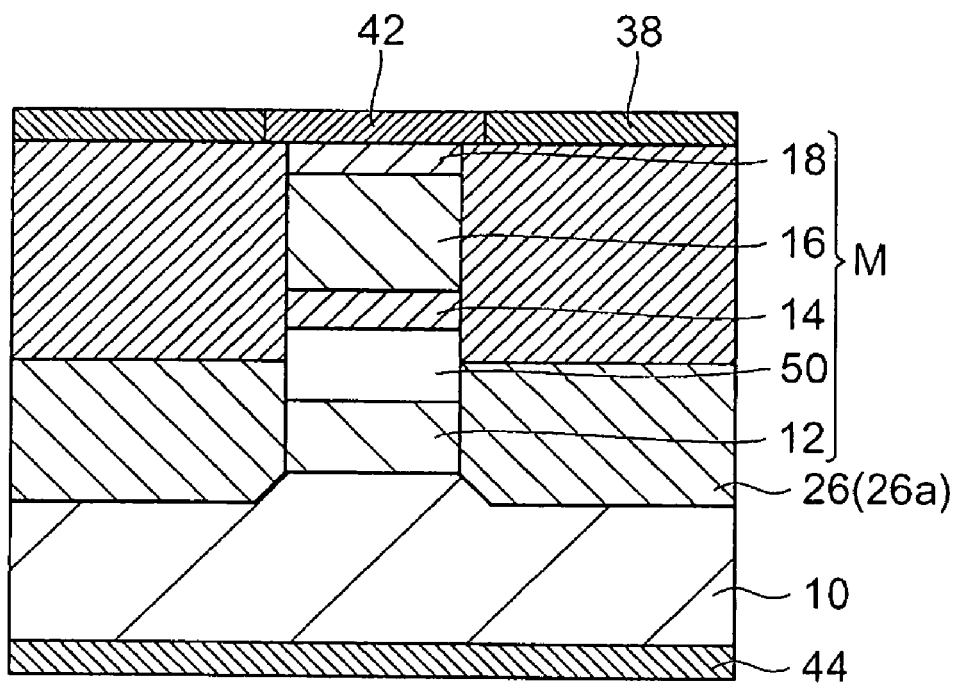
FIG. 6 illustrates a cross section of a modified light-emitting device that includes an un-doped layer between the p-type buffer layer and the active layer.

Moreover, the mesa structure M may further include an un-doped semiconductor layer 50 between the lower SCH layer above mentioned and the p-type buffer layer 12 as illustrated in FIG. 6. This additional layer 50 may be made of un-doped InP and have a thickness of about 100 nm, and may further relax the thickness condition of the n-type blocking layer 26. The present invention, therefore, is limited only as claimed below and the equivalents thereof.

What is claimed is:

1. A method to form a semiconductor light-emitting device, comprising steps of:
    growing semiconductor layers including a p-type buffer layer, an active layer and an n-type cladding layer on a p-type semiconductor substrate in this order;
    forming a mask layer on said semiconductor layers;
    forming a mesa structure by an RIE technique using said mask layer as an etching mask, said mesa structure including said p-type buffer layer, said active layer, and said n-type cladding layer;
    etching said semiconductor substrate so as to expose a surface having (111) orientation or equivalent thereof:
    growing an n-type semiconductor layer directly onto said p-type semiconductor substrate and both sides of said mesa structure by using said mask layer as a mask for selective growth, said n-type semiconductor layer including a plane portion deposited on said p-type semiconductor substrate and a wall portion deposited on surfaces of said mesa structure;
    removing said wall portion of said n-type semiconductor layer deposited on said wall of said mesa structure by etching said wall portion selectively; and
    growing a semi-insulating burying layer doped with iron on said n-type semiconductor layer so as to bury said mesa structure.

2. The method according to claim 1, wherein said step of growing said n-type semiconductor layer includes a step of growing an n-type InP layer.

3. The method according to claim 2,
    wherein said step of etching said n-type semiconductor layer includes a step of etching with an etchant containing hydrochloric acid and acetic acid.

4. The method according to claim 3,
    wherein said step of etching said n-type semiconductor layer selectively includes a step of etching such that said plane portion of said n-type semiconductor layer has a thickness from 0.2 to 0.3 μm.

5. The method according to claim 3,
    wherein said step of etching said n-type semiconductor layer selectively includes a step of etching such that said plane portion of said n-type semiconductor layer has a thickness substantially equal to a distance from a bottom of said active layer to a top of said substrate.

6. The method according to claim 1,
    wherein said step of growing said n-type semiconductor layer includes a step of growing said n-type semiconductor layer such that a top level of said n-type semiconductor layer is substantially identical with a bottom level of said active layer.

7. The method according to claim 1,
    wherein said step of growing said semiconductor layers further includes a step of growing a separate confinement hetero-structure layer between said p-type buffer layer and said active layer.

8. The method according to claim 7,
    wherein said step of growing said semiconductor layers further includes a step of growing an un-doped semiconductor layer between said p-type buffer layer and said separate confinement hetero-structure layer.

9. The method according to claim 1,
    wherein said step of forming said mask layer includes a step of forming a silicon dioxide film as said mask layer.

10. The method according to claim 1,
    wherein said step of growing said n-type semiconductor layer includes a step of growing said n-type semiconductor layer such that said plane portion has a thickness less than a distance from a bottom of said active layer to a top of said substrate.

* * * * *